United States Patent [19]

Schmidt et al.

[11] 4,310,333
[45] Jan. 12, 1982

[54] PROCESS AND PLANT FOR THE GASIFICATION OF SOLID FUELS VIA PARTIAL OXIDATION

[75] Inventors: Volkmar Schmidt, Oberhausen; Bernhard Lieder, Bottrop; Heinrich Scheve, Oberhausen; Hans Dohren, Krefeld, all of Fed. Rep. of Germany

[73] Assignee: Ruhrchemie Aktiengesellschaft, Oberhausen, Fed. Rep. of Germany

[21] Appl. No.: 130,643

[22] Filed: Mar. 17, 1980

Related U.S. Application Data

[63] Continuation of Ser. No. 876,446, Feb. 9, 1978, abandoned.

[30] Foreign Application Priority Data

Feb. 10, 1977 [DE] Fed. Rep. of Germany ....... 2705558

[51] Int. Cl.³ .............................................. C10J 3/68
[52] U.S. Cl. ......................................... 48/77; 48/101; 48/197 R; 48/210; 48/69
[58] Field of Search .................... 48/62 R, 77, 76, 73, 48/69, 101, 197 R, 210, 202, 206, DIG. 2

[56] References Cited

U.S. PATENT DOCUMENTS

| | | | |
|---|---|---|---|
| 3,540,867 | 11/1970 | Baron et al. | 48/206 |
| 3,544,291 | 12/1970 | Schlinger et al. | 48/206 |
| 3,639,261 | 2/1972 | Slater | 48/215 |
| 3,951,615 | 4/1976 | Gernhardt et al. | 48/76 |
| 3,988,123 | 10/1976 | Coates | 48/210 |

Primary Examiner—Joseph M. Golian
Assistant Examiner—George C. Yeung
Attorney, Agent, or Firm—Sprung, Felfe, Horn, Lynch & Kramer

[57] ABSTRACT

An improvement in the process for the gasification of a solid fuel wherein the solid fuel is at least partially oxidized at a temperature above the melting point of ash of the solid fuel and at a pressure of 10–200 bar where the resultant synthesis gas is thereafter cooled in the presence of combustion residues of the solid fuel, and the combustion residues are thereafter discharged directly, the improvement residing in carrying out the gasification in a gasification zone disposed vertically over and in fluid communication with a radiation zone comprising cooling surfaces, the radiation zone have disposed at the bottom thereof and in fluid communication with the radiation zone a water containing bath. The radiation zone is cylindrical or conical, widens by 0 to 15 degrees towards the bottom, is made in a finned wall construction with a relation of height to diameter of ≦6:1 and comprises cooling surfaces. A jet centrally placed in the radiation zone for introducing synthesis gas and combustion residues from the gasification zone into the radiation zone at a flow rate of 1–30 m/sec. The effluents from the gasification zone are directed into the radiation zone and into contact with the water containing bath, whereby combustion residues are retained by the bath. Synthesis gas can thereafter be removed from the radiation zone and further cooled in a convection chamber. Also disclosed is an apparatus for carrying out the process.

9 Claims, 1 Drawing Figure

U.S. Patent     Jan. 12, 1982     4,310,333
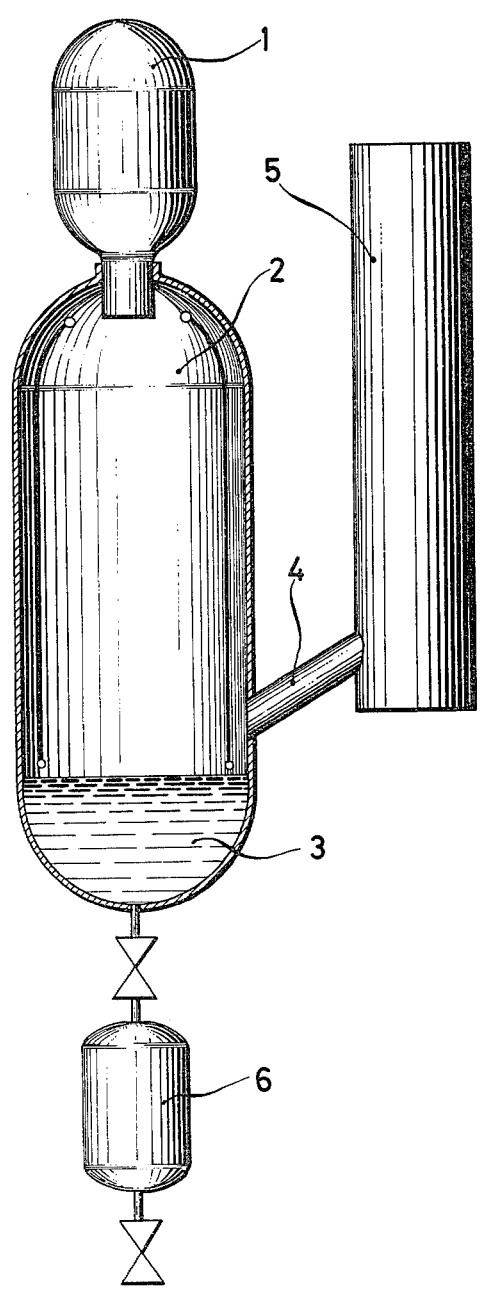

PROCESS AND PLANT FOR THE GASIFICATION OF SOLID FUELS VIA PARTIAL OXIDATION

This is a continuation of application Ser. No. 876,446, filed Feb. 9, 1978, now abandoned.

BACKGROUND OF THE INVENTION

1. Field of the Invention

This invention relates to a process and a plant for the gasification of solid fuels, especially coal, via partial oxidation at temperature above the respective ash melting points and pressures between 10 and 200 bar.

2. Discussion of the Prior Art

The principal processes for the gasification of coal which are of interest today are those operating at raised pressure, as it brings certain advantages. The reaction periods are reduced, the production efficiencies per unit time are increased and the combustion is simultaneously increased. Furthermore, the production efficiency (relative to unit volume of the gasification chamber) increases approximately proportionally to the pressure. As the plants in which synthesis gas is usually employed require high pressure, for example the ammonia, Fischer-Tropsch or Oxo plants, a considerable proportion of the compression costs is therefore saved.

When various types of coal, such as bituminous, high ash and caking coal, are to be processed in a single coal gasification plant, then the coal is fed into the gasification reactor in powdered or pulverized form and gasified at a temperature above the respective ash melting point. By this means almost complete gasification and a controlled slag discharge are guaranteed.

When gasifying coal at raised pressure, the powdered or pulverized coal is mixed with water and injected into the gasification reactor (c.f., U.S. Pat. No. 3,607,157). It is characteristic of these coal dust gasification plants that fuel and oxygen are fed in a co-current. With the process described in U.S. Pat. No. 3,607,157 the supply of oxygen and fuel is fed from above via a combined jet.

In order to remove the liquid slag remaining after the pressure gasification in the pressurized reaction chamber, it is dropped into a water bath and thereby granulated. The water-slag suspension is then fed through a lock out of the pressure chamber. The slag carried with the gas is washed out in a scrubber.

The process described in U.S. Pat. No. 3,607,157 operates under optimal gasification conditions and allows a perfect discharge of the slag. However, with this process, the sensible heat present in the synthesis gas is not recovered and is lost for further utilization at the cooling stage, which operates by injecting water into the hot gas in a scrubber. The method mentioned in the above patent is unsatisfactory with regard to heat technology and thus also from the economic viewpoint.

Furthermore, the resulting discharge of the synthesis gas from the reaction chamber, which takes place in the above-named process during the separation of slag and gas at rightangles to the down dip of the slag, leads to blockages in the pipe connected to the gasification reactor. These obstructions are caused by liquid and viscous slag particles, which are swept along with the gas flow and adhere to the walls of the pipe on impact.

It is an object of this invention, therefore, to provide a process for the gasification of all types of coal at raised pressure and simultaneously to utilize the sensible heat present in the resulting synthesis gas to the extent possible.

It has, however, to be taken into account that the utilization of the heat via steam generation in a waste heat plant, for example in power stations and other gasification plants, cannot be directly applied to the coal gasification described here, which takes place at raised pressure and at very high temperatures. The gasification must be carried out at high temperatures in order to liquefy the slag, yet the required process must also allow for a cooling of the synthesis gas, containing the originally liquid and viscous slag particles. In this context, care must be taken that the pipe system of the waste heat plant does not become blocked by deposits of the liquid or viscous slag particles, which are carried in the gas. Additionally, due to the further development of the pressure gasification process, in which the synthesis gas and all the slag leave the reaction together at the bottom of the gasification reactor, the part of the slag which is in the form of large liquid or viscous agglomerates and can only be solidified by indirect cooling causing unjustifiable expense, must be separated from the gas flow.

One possible solution to the problem is to remix the hot synthesis gas straight after its production with cooled synthesis gas. By this means slag particles in the gas solidify before entering the cooling system and thus do not block the cooling pipes. The disadvantages of this solution lie in the considerable loss of temperature gradient in the cooling plant and the necessary enlargement of the heating surfaces. The reintroduction of large amounts of cooled gases also necessitates the use of a fan operating at raised pressure. Additionally, cyclones or other mechanical separators are required for the discharge of the increased amount of solid slag particles. This is expensive due to the high pressure and, in each case, requires an additional discharge lock.

SUMMARY OF THE INVENTION

In accordance with this invention there is provided an improvement in a process for the gasification of a solid fuel wherein said solid fuel is at least partially oxidized at a temperature above the melting point of the ash of said solid fuel and at a pressure of 10–200 bar, and the resultant synthesis gas is thereafter cooled in the presence of combustion residues of said solid fuel and said combustion residues are thereafter discharged directly and the synthesis gas is further cooled in a convection chamber, the improvement comprising:

A. Carrying out the gasification in a gasification zone disposed vertically over and in fluid communication with a radiation zone comprising cooling surfaces, said radiation zone having disposed at the bottom thereof and in fluid communication with said radiation zone a water containing bath;

B. directing the effluents from said gasification zone into said radiation zone and into contact with said water containing bath whereby combustion residues are retained by said bath; and C. removing synthesis gas from said radiation zone and cooling the same further in said convection chamber.

The present invention is further directed to an apparatus for the gasification of a solid fuel, which apparatus comprises a high pressure reactor disposed vertically above and in fluid communication with a radiation chamber having means for cooling inner surfaces thereof, said radiation chamber having at the bottom thereof a waste containing bath, said radiation chamber being in gaseous fluid communication with a convection chamber, said apparatus further comprising a lock below the upper surface of said bath, which lock is in fluid communication with said water bath whether solidified residues contained in said bath can be withdrawn through said lock. The present invention represents a better alternative to the problems heretofore faced by those skilled in solid fuel gasification art. At the heart of the invention there is the use of a radiation chamber situated between the gasification reactor and the convection chamber.

A better alternative solution to the problem on hand is the procedure involving a radiation chamber situated between the gasification reactor and the convection chamber.

Radiation chambers are used in power stations and in coal dust gasification plants, operating at atmospheric pressure, for the extraction of waste heat in the temperature ranges in which slag particles in the gas are still liquid or viscous. The gases are cooled in the radiation chamber until the slag particles solidify before entering the coupled convection chamber.

Unlike convection chambers which are immediately obstructed by the accumulation of liquid or viscous residues, the deposits and agglomerations of the slag on the cooling surfaces of the radiation chamber can be satisfactorily removed with the aid of the so-called soot blowers, i.e., jets which are operated with water or steam at high pressure. It is recommended that, at temperatures above 900° C. for reasons of durability, equipment be used which does not lie in the hot gas flow (front plate and longitudinal feed blowers).

The invention, therefore, relates to a process for the gasification of solid fuels, especially coal, via partial oxidation in the presence of oxygen or oxygen-containing compounds at temperatures above the respective ash melting point and at pressures of 10 to 200 bar, followed by cooling of the synthesis gas as well as the combustion residues. The solidified combustion residues are then directly discharged. The process is characterized by the gas, together with the combustion residues from the gasification reactor, flowing at a rate of 1-30 m/sec, preferably 3-15 m/sec, through a jet centrally placed in the radiation chamber, which is situated immediately below the reactor. The radiation chamber is cylindrical or conical, widening by 0°-15°, preferably 3°-10°, towards the bottom. In the finned wall construction the ratio of the height of the finned wall to the diameter is $\leq 6:1$. The gas is cooled to the extent that until the liquid combustion residues, carried in the gas as fine droplets, solidify before they reach the coupled convection chamber. By deflecting the gas, these residues in the form of crude agglomerates are deposited onto the surface of a water bath that is directly beneath the radiation chamber. The residues are then separated off into the water, where they are granulated and, as a water suspension, removed from the pressure chamber by means of a lock. The boiler feed water necessary for the steam generation in the radiation chamber is preheated with the aid of the sensible heat of the combustion residues.

An optimal utilization of heat in the waste heat system can be obtained with the pressure gasification of every type of coal with the procedure according to the invention and the corresponding equipment. This is carried out using the highest possible temperature gradient, without the formation of blockages in the waste heat system, which would noticeably hinder the operation of the plant. Simultaneously, most of the solidified slag is removed together with the liquid slag from the gasification chamber and therefore only one discharge lock is required for removing the total slag.

The process according to the invention can be applied to processes for the gasification of solid fuels, especially coal via partial oxidation in the presence of oxygen or oxygen-containing compounds. The processes operate at raised pressure and the ashes, obtained in the melted state, are removed at the bottom of the reaction chamber together with the hot synthesis gas.

A special feature of the invention is the use of a radiation chamber for the recovery of part of the heat contained in the reaction product and the positioning of this radiation chamber directly below the gasification reactor.

In coal gasification plants operating at raised pressure and at temperatures above the respective ash melting point, the gasification of fuel and oxygen or oxygen-containing compounds is carried out in co-current while flowing from the top to the bottom. Therefore, the resulting synthesis gas and the liquid residues have to be drawn off below the gasification zone.

In order to remove the liquid residue resulting at the gasification during operation, it is expedient to allow them to fall into a water bath, where they are granulated and, as a water suspension, are removed through a lock.

In order to guarantee that the slag, in the form of crude agglomerates can fall through the radiation chamber without obstruction, the vertically aligned radiation chamber is positioned directly below the gasification reactor. While flowing through the radiation chamber, from top to bottom, the gas is cooled to such an extent that the fine droplets of slag transported in the gas flow, solidify. After the solidification of these fine droplets, the gas is immediately deflected onto the surface of the water bath and removed at the side. The sharp deflection causes a large amount of the solidified slag to be pitched into the water bath by centrifugal force.

Synthesis gas, flowing at high velocity through a jet, enters the centre of the top of the radiation chamber. The gas then forms a turbulent flow which transports the combustion residues thereby preventing them from coming into contact which the cooling pipes or the wall of the radiation chamber.

The term "finned wall construction" (of the radiation chamber) means that the space between the individual cooling tubes is closed in the direction of the circumference with welded cross-pieces or fins. This construction ensures that the wall of the radiation chamber does not come into contact with the hot synthesis gas. The wall can therefore be made of steel and does not require a brick lining. Furthermore, this finned wall construction prevents the deposition of slag between the cooling tubes or between the cooling tubes and the wall of the radiation chamber.

The free cross-section of the radiation chamber should just be large enough to prevent the spraying of liquid slag onto the radiation wall. The radiation surface should be long enough to insure a sufficient cooling of the gas taking the contamination of the walls into account, while preventing a blockage of the coupled convection chamber with the liquid or viscous slag particles.

The very fine solidified slag particles, which despite the deflection of the gas are still transported in it, do not adhere to the pipe walls. A coupled convection chamber in which the gas is further cooled is neither coated nor blocked by this fine solid dust. The shape of the cross-section of the gas discharge pipe, directly after the deflection, should preferably be such that as little as possible of the slag dust is transported with the slow moving gas. The amount of dust which is carried through the convection chamber with the gas can be reduced to such an extent that cyclones or similar separating equipment are not required. The dust remaining in the gas is washed out in a coupled quench stage, which is necessary for the final cooling of the gas.

As the radiation chamber is positioned below the gasification chamber and above the water bath for the slag discharge, the unavoidable slag deposits on the pipes of the radiation chamber can be removed with the aid of soot blowers, preferably operated with water at a high pressure of 300 to 500 bar. As the water does not reach the gasification chamber, it does not affect the gasification. The jets are only in operation for a short time, so that no interference in the vaporization efficiency of the radiation chamber occurs.

It may be necessary to clean the cooling pipes of the radiation chamber at certain intervals. Owing to the slag deposits which have a heat insulation effect, a reduction of the heat transfer occurs, and the cooling effect of the radiation chamber is therefore considerably reduced. The temperature of the discharged synthesis gas from the radiation chamber therefore increases with time, due to the growing slag deposits on the cooling pipes. For the protection of the connected apparatus above all the convection chamber against slag deposits, the temperature of the gas leaving the gas chamber should not be allowed to increase to such an extent that the solidification of the slag particles carried with the gas can no longer be guaranteed.

In order that the cleaning occurs punctually, independent of the reliability of the operators and with as little trouble as possible, it is expedient to automate the cleaning process. The ideal solution is to insure that the admission of water into the soot blower jets is initiated with rising gas temperature at the outlet of the radiation chamber.

BRIEF DESCRIPTION OF THE DRAWING

Referring to the accompanying figure, FIG. 1, the same represents a side elevation partly in section showing the apparatus used for carrying out the solid fuel gasification.

DESCRIPTION OF SPECIFIC EMBODIMENTS

The apparatus for the process according to the invention consists of a pressure reactor 1 for the gasification of coal with oxygen or oxygen-containing compounds, a radiation chamber 2 directly below the reactor, which has a water bath 3 at its base and a convection chamber 5 connected by a pipe 4 to the radiation chamber and a slag discharge lock 6 below the water bath.

The reaction product consisting mainly of carbon monoxide, hydrogen and slag is obtained from the gasification of solid fuels, preferably coal with oxygen or oxygen-containing compounds. This reaction product is introduced into the radiation chamber situated directly below the reactor. The cooling efficiency of the radiation chamber should be sufficient to insure solidification of the smaller slag particles which are carried in the gas before they reach the convection chamber. This prevents adhesion. The larger agglomerated slag particles fall through the radiation chamber into the water bath. The slag cools rapidly, solidifies and disintegrates into small granules. The separated granulated slag is suspended in the water and removed by the lock.

EXAMPLE 13,780 kg/hr coal/water slurry are gasified with 7,484 kg/hr oxygen in a reactor at 37 bar and 1,390° C. The resulting 14,380 kg/hr synthesis gas flow vertically to the bottom of the reactor and are removed via an outlet jet with a diameter of 965 mm. The gas transports 1,215 kg/hr slag, 256 kg/hr non-combusted carbon and 5,416 kg/hr water vapour. The synthesis gas subsequently flows through a cylindrical radiation chamber with a finned wall construction, which is aligned immediately below the reactor. The radiation chamber is 13 m long and possesses a diameter of 3.3 m. The cooling surface, which is 83 $m^2$, consists of a ring of pipes (57 mm×4 mm) with a pitch circle diameter of 3 m.

After the synthesis gas is deflected over a water bath at the bottom of the radiation chamber and cooled to 900° C., it leaves the radiation chamber via side outlet. Whereas 924 kg/hr slag and 246 kg/hr non-combusted carbon are separated into the water bath, 290 kg/hr slag, in the form of finely divided solidified particles, and 110 kg/hr non-combusted chamber are still transported with the synthesis gas on leaving the radiation chamber.

20,000 kg/hr water (at a temperature of 186° C.) are removed from the water bath. This hot water serves to preheat the completely desalinated feed water which is used in the cooling pipes of the radiation chamber. The completely desalinated water is converted into steam at 44 bar in the cooling pipes of the radiation chamber.

What is claimed is:

1. In a process for the gasification of solid fuel wherein said solid fuel is at least partially oxidized at a temperature above the melting point of the ash of said solid fuel and at a pressure of 10–200 bar and the resultant synthesis gas is thereafter cooled in the presence of combustion residues of the solid fuel and said combustion residues are thereafter discharged directly and the synthesis gas is further cooled in a convection chamber, the improvement consisting essentially of:

A. carrying out the gasification in a gasification zone disposed vertically over and in fluid communication with a radiation zone which is cylindrical or conical, widening by 0° to 15° towards the bottom, made in a finned wall construction with a relation of height to diameter of ≦6:1 comprising cooling surfaces, said radiation zone having disposed at the bottom thereof and in fluid communication with said radiation zone a water containing bath;
   B. directing the effluents from said gasification zone through a jet centrally placed in the radiation chamber with flowing-rate of 1–30 m/sec, into said radiation zone indirectly cooling said effluents therein by radiation cooling and directing said effluents into contact with said water containing bath whereby combustion residues are retained by said bath; and
   C. removing synthesis gas from said radiation zone and indirectly cooling the same further in said convection chamber;
   D. preheating desalinated feed water by water from said water bath and converting said desalinated feed water into steam in cooling pipes defining said radiation zone.

2. A process according to claim 1 wherein said radiation zone is in gaseous fluid communication with said convection chamber above the level of said water bath, synthesis gas containing combustion residues is passed through said radiation zone and deflected off of the surface of said water bath, thereby separating said residues from said synthesis gas and synthesis gas is caused to flow upwardly into said convection chamber.

3. A process according to claim 1 wherein the inner surfaces of said radiation zone are periodically cleaned of deposited residues by directing a fluid thereagainst.

4. A process according to claim 3 wherein said fluid is directed against said inner surfaces in response to rising temperatures of synthesis gas exiting said radiation zone.

5. A process according to claim 1 wherein said widening is at the rate of 3° to 10° and the effluents from said gasification zone are directed through said jet at a rate of 3–15 m/sec.

6. A process according to claim 1 wherein said desalinated water after being heated by the contents of said radiation chamber is further heated by water of said water bath.

7. A process for the gasification of a solid combustible, especially coal, which consists essentially of partially oxidizing said solid combustible in the presence of oxygen or an oxygen-containing compound in a gasification zone at a temperature above the melting point of any ash of said solid combustible and at a pressure of 10 to 200 bar whereby to form synthesis gas and combustion residue of said solid combustible, passing said synthesis gas together with said combustion residue at a flow rate of 1–30 m/seconds through a radiation zone consisting essentially of an outlet and a cooling jacket situated directly below said gasification zone and in fluid communication therewith, said radiation zone is cylindrical or conical, widens by 0 to 15 degrees towards the bottom, is made in a finned wall construction with a relation of height to diameter of $\leq 6:1$ and comprises cooling surfaces directing said synthesis gas containing said combustion residue against a water bath situated below said radiation zone whereby said synthesis gas is deflected against said water bath, the synthesis gas being cooled by a process consisting essentially of passing said synthesis gas against said cooling jacket and absorbing the heat of radiation of said synthesis gas by said cooling jacket to such an extent that the entrained combustion residues carried in the form of small droplets in said synthesis gas solidify before contacting said outlet and thereafter removing water from said water bath containing solidified combustion residue.

8. A process for the gasification of a solid combustible which consists essentially of partially oxidizing said solid combustible in the presence of oxygen or an oxygen-containing compound in a gasification zone disposed vertically over and in fluid communication with a radiation zone which is cylindrical or conical, widening by 0° to 15° towards the bottom, made in a finned wall construction with a relationship of height to diameter of $\leq 6:1$ comprising cooling surfaces, said radiation zone having disposed at the bottom thereof and in fluid communication with said radiation zone a water-containing bath, the partial oxidizing of said solid combustible being conducted at a temperature above the melting point of any ash of said solid combustible and at a pressure of 10 to 200 bars whereby to form synthesis gas and combustion residue of said solid combustible, passing said synthesis gas together with said combustion residue through said radiation zone which consists essentially of an outlet and a cooling jacket situated directly below said gasification zone and in fluid communication therewith, indirectly cooling said synthesis gas and combustion residue in said finned wall radiation zone, directing said synthesis gas containing said combustion residue against said water bath situated below said radiation zone whereby said synthesis gas is deflected against said water bath, said synthesis gas together with said combustion residue being passed through a jet centrally placed in said radiation zone with a flow rate of 1–30 m/seconds into said radiation zone whereby combustion residues are retained by said bath, the synthesis gas being cooled by a process consisting essentially of passing said synthesis gas parallel to said cooling jacket and absorbing, the heat of radiation of said synthesis gas by said cooling jacket to such an extent that the entrained combustion residues carried in the form of small droplets in said synthesis gas solidify before contacting said outlet and thereafter removing water from said water bath containing solidified combustion residue and preheating desalinated feed water by water from said water bath and converting said desalinated feed water into steam in cooling pipes defining said radiation zone.

9. Apparatus for the gasification of a solid fuel consisting essentially of a high pressure reactor disposed vertically over a radiation chamber which is cylindrical or conical, widens by 0 to 15 degrees towards the bottom, is made in a finned wall construction with a relation of height to diameter of $\leq 6:1$ and comprises cooling surfaces, a jet centrally placed in said radiation chamber for introducing synthesis gas and combustion residues from said high pressure reactor into said radiation chamber at a flow rate of 1–30 m/sec; said radiation chamber having means for cooling inner surfaces thereof, said radiation chamber having at the bottom thereof a water-containing bath, said radiation chamber connected to a conduit connecting means connecting said radiation chamber with a convection chamber, said apparatus further comprising a lock below the upper surface of said bath, which lock is in a conduit from said water bath whereby combustion residues are solidified upon contact with said water bath to form a solidified residue and said solidified residue contained in said bath can be withdrawn through said lock and said radiation chamber is equipped with means for indirectly cooling the synthesis gas and combustion residues therein by radiation cooling.

* * * * *